United States Patent [19]

Lazar et al.

[11] 4,331,369
[45] May 25, 1982

[54] CHASSIS INTEGRATED SLIDE

[75] Inventors: Janos J. Lazar, Redwood City; William B. Fazakerly, Saratoga, both of Calif.

[73] Assignee: Scientific Micro Systems, Inc., Mountain View, Calif.

[21] Appl. No.: 152,473

[22] Filed: May 22, 1980

[51] Int. Cl.³ .................. A47B 88/00; A47B 63/02; F16C 29/00
[52] U.S. Cl. ................... 312/334; 312/338; 312/341 NR; 308/3.6
[58] Field of Search .............. 312/333, 334, 338, 339, 312/330 R, 348, 320, 342, 341 NR; 308/3.6

[56] References Cited

U.S. PATENT DOCUMENTS

| 1,231,291 | 6/1917 | Otte | 312/338 |
| 2,655,422 | 10/1953 | Gussack | 312/333 |
| 2,823,973 | 2/1958 | Carver et al. | 312/348 |
| 2,856,450 | 10/1958 | Padgett et al. | 312/320 |
| 3,059,986 | 10/1962 | Miller, Jr. | 312/338 |
| 3,259,447 | 7/1966 | Deutsch | 312/348 |
| 3,371,968 | 3/1968 | Loake | 312/333 |
| 4,004,841 | 1/1977 | Van Der Ley | 312/339 |
| 4,121,876 | 10/1978 | Ratti | 312/330 R |
| 4,183,596 | 1/1980 | Greene et al. | 312/333 |
| 4,232,921 | 11/1980 | Peele | 312/348 |

Primary Examiner—Victor N. Sakran
Attorney, Agent, or Firm—David E. Lovejoy

[57] ABSTRACT

A compact chassis-integrated slide assembly for use with electronic or other equipment. A movable chassis is translated relative to a stationary rack. Two or more slide guides are fastened to each of the two side walls of the chassis. The slide guides are adapted to slidably engage a channel in a floating slide member. The floating slide member supports the chassis while at the same time permitting relative translation of the chassis and the floating slide by means of the slide guide sliding in the channel of the floating slide. The floating slide in turn slidably engages a rack sheath where the rack sheath is adapted to be rigidly attached to the stationary rack.

11 Claims, 9 Drawing Figures

U.S. Patent  May 25, 1982  Sheet 1 of 2  4,331,369
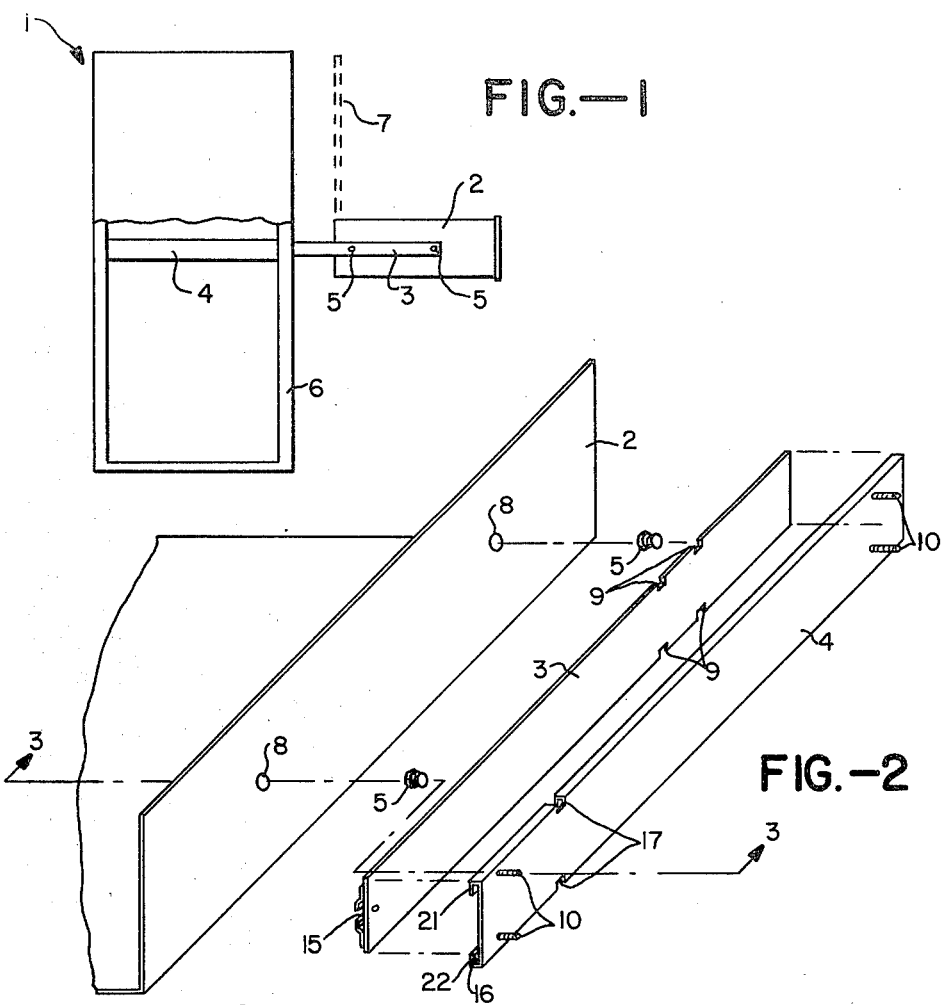
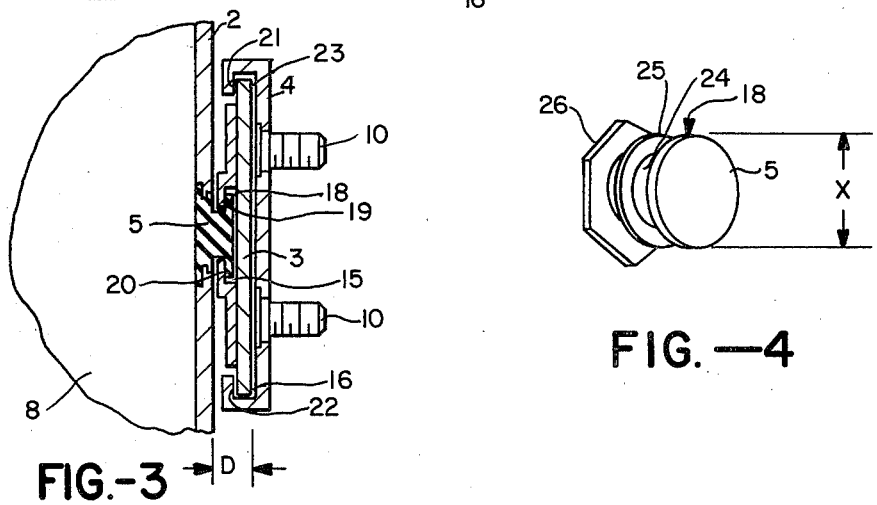

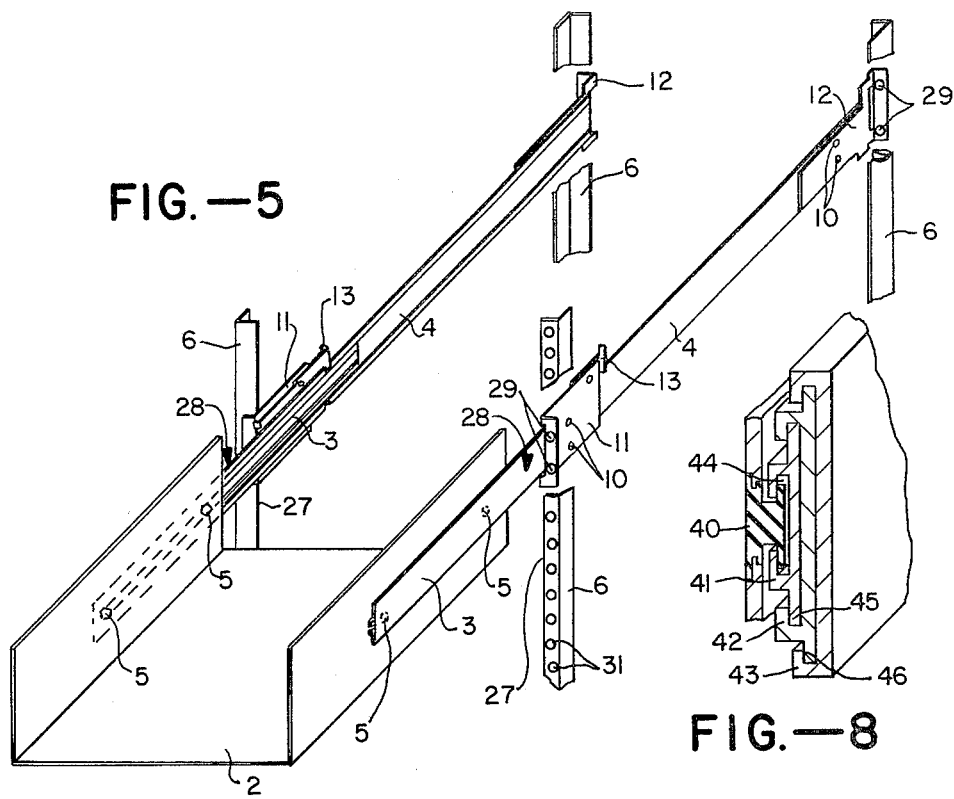
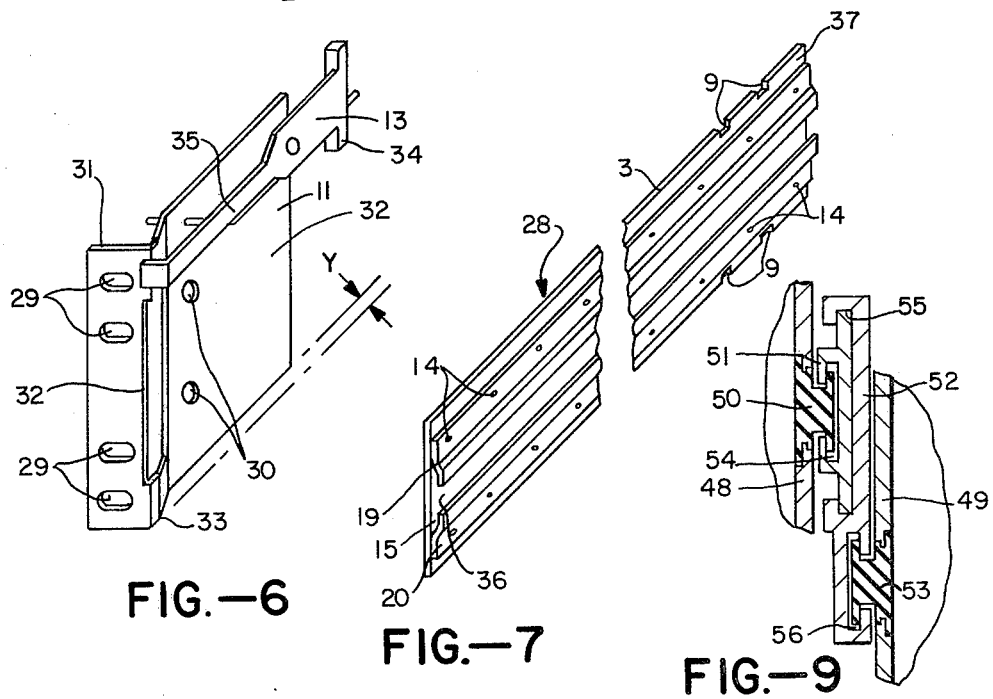

CHASSIS INTEGRATED SLIDE

BACKGROUND OF THE INVENTION

The present invention relates to the field of slidable chassis and other slide assemblies and particularly to slide assemblies for slidably mounting electronic equipment.

Racks and other structures for holding electronic equipment are frequently standardized with predetermined dimensions. For example, one typical rack is nineteen inches in width with various depths.

Where standardized racks are employed and in other special environments, a need exists for providing as much space as possible for the electronic equipment. Furthermore, for electronic equipment, it is generally desirable that the sliding assembly extend fully from the rack in order that full access to the electronic equipment can be had for maintenance or other purposes.

Conventional and commercially available slide assemblies unduly intrude upon the available space. Furthermore, certain of the slide assemblies do not provide for adequate extension of the electronic equipment from the rack.

In accordance with the above background, it is an objective of the present invention to provide an improved slide assembly which overcomes the problems attendant conventional and commercially available slides.

SUMMARY OF THE INVENTION

The present invention is a compact chassis-integrated slide assembly for use with electronic or other equipment. In accordance with one embodiment, a movable chassis is translated relative to a stationary rack. The chassis includes side walls which hold slide guides. The slide guides, in one embodiment, are button-shaped members rigidly attached to the chassis side walls. Two or more slide guides are fastened to each of the two side walls of the chassis. The slide guides are adapted to slidably engage a channel in a floating slide member. The floating slide member supports the chassis while at the same time permitting relative translation of the chassis and the floating slide by means of the slide guide sliding in the channel of the floating slide. The floating slide in turn slidably engages a rack sheath where the rack sheath is adapted to be rigidly attached to the stationary rack.

In one embodiment, the floating slide is relatively movable both with respect to the stationary rack sheath and with respect to the chassis. The slide assembly is telescoping in operation whereby the chassis slides to a position when extended from the rack such that the rear of the chassis is positioned beyond the front of the rack. This telescoping extension is achieved by the floating slide which translates relative to both the chassis and the stationary rack sheath. The rack sheath holds the floating slide within a clearance distance of the rack so that a minimum of space is occupied by the slide assembly.

The slide assembly is readily locked in any position of translation by a rack mounted engagement member which is spring-loaded or otherwise forced into notches located in the floating slide member.

In accordance with the above summary, the present invention achieves the objective of providing an improved integrated chassis slide assembly which efficiently minimizes the amount of space required for the slide assembly and thereby provides a maximum amount of space for use of electronic equipment.

Additional objects and features of the present invention will appear from the following description in which the preferred embodiments of the invention have been set forth in detail in conjunction with the drawings.

BRIEF DESCRIPTION OF THE DRAWINGS

FIG. 1 depicts a side view of a stationary rack and a chassis extended fully from the rack by means of the slide assembly of the present invention.

FIG. 2 depicts an exploded view of one side wall of the chassis and the corresponding chassis-integrated slide assembly.

FIG. 3 depicts a cross-sectional view of the chassis and slide assembly, in a nonexploded view taken along the section line 3—3 of FIG. 2.

FIG. 4 depicts a perspective view of a slide guide which is adapted to be press-fitted to a chassis.

FIG. 5 depicts a perspective view of the chassis-integrated slide assembly including front and rear brackets adapted for mounting to the rails of a rack.

FIG. 6 depicts a rack mounting bracket and a spring-loaded locking member for engaging the floating slide to lock the chassis in predetermined positions.

FIG. 7 depicts a perspective view of one floating slide member.

FIGS. 8 and 9 depict sectional views of two different double-floating slide embodiments.

DETAILED DESCRIPTION

In FIG. 1, the rack 1 is constructed from rack rails 6 which form a stationary frame. Attached to the rack rail 6 is a rack sheath 4 which is rigidly attached to the rails 6 and the rack 1. A sliding chassis 2, shown extended in FIG. 1, is engaged to slide in and out from the sheath 4 on a floating slide 3. The floating slide 3 slides in and out of the sheath 4 when the chassis 2 is translated relative to the rack 1.

The chassis 2 is slidably engaged to the floating slide 3 by slide guides 5. The floating slide 3 is relatively movable with respect to the rack sheath 4 and with respect to the chassis 2.

With the chassis extended as shown in FIG. 2, the rear of the chassis extends substantially beyond the front of the rack. With such an extension, a cover 7 for the chassis 2 can be opened vertically without interfering with the rack 1 or any equipment (not shown) which may extend beyond the front of the rack 1.

In FIG. 2, a side wall of the chassis 2 includes holes 8. The holes 8 are adapted to receive the slide guides 5. Each slide guide 5 includes a button-shaped end portion 18, a smaller shaft 24, and flanges 25 and 26 for mounting into the holes 8 of the chassis 2. The floating middle slide 3 has a channel 15 which slidably engages the button-shaped end portion 18 of the slide guides 5. The floating slide 3 has one or more notches 9 which are located to engage a spring-loaded lock member. The floating slide 3 is adapted to slidably engage the sheath 4 in a channel 16. The floating slide 3 is relatively movable both with respect to the chassis 2 and with respect to the rack sheath 4. Openings 17 in the sheath 4 provide access to the slots 9 in the floating slide 3. Sheath 4 includes the mounting studs 10 which are employed to rigidly attach the sheath 4 to the rack 6 using rack brackets.

In FIG. 3, the slide guide 5 is shown pressed into the hole 8 of the side wall of the chassis 2 and thus is rigidly attached to the chassis wall for supporting the chassis.

The button-shaped end portion of the slide guide 5 fits within the channel 15 of the floating slide 3. The face portions 19 and 20 of the floating slide 3 extend over the end portion 18 so that the slide guide 5 cannot be moved relative to the floating slide 3 in the plane of the papers. The slide guide 5 is free to move within the channel 15, in a plane normal to the paper, so that the chassis 2 is slidably supported by the floating slide 3.

In FIG. 3, the floating slide 3 slides within the channel 16 and is held in place by the face flanges 21 and 22 of the rack sheath 4. The face flanges 21 and 22 hold the floating slide from movement in the plane of the paper while allowing relative movement of the floating slide 3 and the sheath 4 in a plane normal to the paper. Mounting studs 10 are provided for rigidly attaching the sheath 4 to the rack 1.

It is apparent from FIG. 3 that the clearance distance between the side wall of chassis 2 and the outer face of the floating slide is the dimension D. The dimension D is typically 0.210 inch or smaller thereby minimizing the amount of space required by the slide assembly.

In FIG. 4, the slide guide 5 is shown with button-shaped portion 18 in the form of a cylinder having a diameter X. The end portion 18 is attached at the end of a shaft portion 24 which has a diameter less than X so as to fit between the opening formed by the face portions 19 and 20 of floating slide 3. The slide guide 5 includes a first flange 25 and a second flange 26 suitable for press fitting into the holes 8 of the chassis 2. Of course, alternative means can be provided for rigidly attaching the slide guide of FIG. 4 to the chassis 2. For example, the stud 24 can be threaded at the extreme end near flange 26 so that a nut can be turned onto the threads on one side of the hole 8 tightening down against the larger flange 25. Welding, brazing or any other convenient method can be employed for attaching the slide guide to the chassis 2.

In FIG. 5, two rack sheaths 4 are located for mounting to rack rails 6 appearing on either side of the chassis 2. Special rear brackets 12 and front brackets 11 are provided for rigidly attaching the slide sheaths 4 to the rack rails 6. The floating slides 3 translate within the sheaths 4 in the manner previously described. The brackets 11 and 12 are constructed so that the floating slide 3 has its outwardly facing surface 28 located within a clearance distance of the inwardly facing edge 27 of rail 6. In this manner, a minimal amount of space is utilized for the slide assembly.

Each of the brackets 11 and 12 includes holes 29 which align with the holes 31 in the rails 36. For clarity in the drawings, only the mounting holes in the front right rails 6 are shown in FIG. 5. Nuts and bolts or other suitable mounting hardware is employed to attach the brackets to the rail 6.

In FIG. 6, further details of the left front bracket 11 are shown. The bracket includes holes 29 for mounting to the holes 31 in the rail 6. Further, the bracket includes holes 30 for receiving the threaded stubs 10 of the rack sheath 4. The holes 29 are in a mounting flange 31 which includes a cutout portion along the inside edge 32. The cutout portion along edge 32 provides for clearance of the floating slide 3 when it extends from the rack sheath 4. The rack sheath 4 is rigidly attached to the bracket plate 32. The bracket plate 32 of the bracket 11 is constructed to be recessed from the extreme inside edge 33 by an offset dimension Y. When the bracket 11 is attached to the rail 6, the offset Y permits the outwardly facing surface 28 of the floating slide 3 to be located within a clearance distance of the inwardly facing edge 27 of the rack rail 6 without interference from the bracket 11. The width of the flange 31 on the bracket 11 is typically made the same width as the rack rail 6 and the recess along the edge 32 and the offset Y of the face plate 32 allow the sheath 4 and the floating slide 3 to be mounted such that only a clearance distance is located between the floating slide 3 and the rack rail 6.

In FIg. 6, the bracket 11 includes a locking member having an end portion 34 which is adapted to engage any one of the notches 9 in floating slide 3.

In FIG. 7, the floating slide 3 is shown with a stop 36 rigidly attached to slide 3 in the channel 15. When the slide guide 5 contacts the stop 36, the chassis 2 is prevented from further travel relative to the floating slide 3. The stop 36 is typically a nut and bolt assembly but can be a member attached in any convenient way. The face members 19 and 20 are typically spot welded at weld spots 14 or otherwise are attached to the plate 37. Plate 37 has notches 9 both along the top and/or the bottom for engagement by the spring-loaded locking arm 13.

In FIG. 8, an alternate embodiment is shown in which two floating slides are employed. The slide guide 40 in FIG. 8 functions in the same way as the slide guide 5 in FIG. 3. A first floating slide 41 is adapted to slidably engage the slide guide 40. In FIG. 8, floating slide 41 is like the floating slide 3 in FIG. 3. In FIG. 8, a second floating slide 42 slidably engages the first floating slide 41. The second floating slide 42 has a channel 44 which is adapted to receive the first floating slide 41. The construction of the second floating slide 42 in FIG. 8 is similar to the inner construction of the rack sheath 4 of FIG. 3 except no external mounting studs 10 are employed on slide 42. In FIG. 8, a rack sheath 43 substantially identical to the rack sheath 4 of FIG. 3 is provided with a channel 45 for receiving the second floating slide 42. The double floating slide embodiment of FIG. 8 is typically employed where greater extension of the chassis from the rack is desired. While single floating slides and double floating slides are possible as described, three or more floating slides can be employed.

If the full extension capability available with floating slides is not desired, the floating slide can be eliminated so that the chassis integrated slide guide directly engages the rack sheath. In such an embodiment, the floating slide 3 is modified to include mounting studs permanently affixed such that the rack sheath 4 is eliminated. Such an embodiment, while reducing the extent to which the chassis can be extended out from the rack, maintains the benefit of maximum use of the available width of the rack.

In FIG. 9, a second alternate embodiment of a double-floating slide member is shown. A first slide guide 50 is ridigly attached to the chassis 48 and a second slide guide 53 is rigidly attached to a rack member 49 which, like the sheath 4 of FIG. 5, rigidly attaches to the rack rails.

In FIG. 9, the slide guide 50 engages the channel 54 of a first floating slide 51. The floating slide 51 is substantially identical to the floating slide 3 of FIG. 3 except that in FIG. 9, the member is shown as cast or extruded from a single piece of metal or other material.

The floating slide 51, in turn, slidably engages the channel 55, having an opening toward the chassis, of a second floating slide 52. Slide 52, in addition to the channel 55 which has an opening facing the chassis 48, includes a second channel 56 which has an opening in the opposite direction from the channel 55, that is, toward the rack member 49. The slide guide 53 slidably engages the channel 56 of the second floating slide 52. The floating slide 52, therefore, is relatively movable with respect to the rack member 49 and slide guide 53 as well as being relatively movable with respect to the first floating slide 51. The floating slide 51 is relatively movable with respect to both the chassis 48 and slide guide 50 and to the second floating slide 52. The embodiment of FIG. 9 includes two telescoping and floating slides in a manner similar to the FIG. 8 embodiment. The FIG. 9 embodiment, however, requires even less width than the FIG. 8 embodiment due to the use of the rigidly attached slide guides 50 and 43. The FIG. 8 and FIG. 9 embodiments each include two or more slide guides, like slide guides 5 of FIG. 2, in order to properly support the slide assembly. Note in FIG. 9 that the dimension D need be no greater than the dimension D in FIG. 3 thereby maximizing the amount of space for the chassis.

While the embodiments have been described in which all of the bearing surfaces are metal, roller and ball bearing members may be incorporated to improve the smoothness in rolling or to reduce wear of the bearing surfaces. It has been found, however, that for electronic equipment which is infrequently withdrawn from the rack, no need exists for such elaborate mechanisms.

While the chassis integrated slide assembly has been described in embodiments in which the slide guide is integrally attached to the chassis and the sheath is attached to the rack, the slide guides and sheaths can be reversed. In such a reversal, the sheath is made an integral part of the chassis and the slide guide is rigidly attached to the rack whereby the floating slide still functions in the same way.

While the invention has been particularly shown and described with reference to the preferred embodiments thereof, it will be understood by those skilled in the art that those changes in form and details may be made therein without departing from the spirit and the scope of the invention.

What is claimed is:

1. A slide assembly for mounting a chassis relatively movable with respect to a rack comprising:
    slide guide means for rigid attachment to the chassis, said slide guide means having two or more fixed studs,
    a floating slide means having a channel for slidably engaging said studs and for supporting said chassis, said floating slide means having face portions extending over the ends of said studs for holding said studs,
    sheath means having a channel for slidably engaging said floating slide, said sheath means having means for rigid attachment whereby said chassis is relatively movable with respect to said rack by the translation of said floating slide member with respect to said slide guide means and by the relative translation of said floating slide member with respect to said sheath means.

2. The slide assembly of claim 1 wherein said chassis includes side mounting holes and wherein said studs are adapted to be press fitted into said mounting holes and have non-moving button-shaped ends for engaging said floating slide means.

3. The side assembly of claim 1 wherein said sheath means includes bracket means for rigidly attaching a sheath to said rack, said bracket means having a recess whereby the outwardly facing side of said floating slide means is positioned within a clearance distance of the inwardly facing edge of the rack whereby the slide assembly requires a minimum amount of space so as to provide maximum space for said chassis in said rack.

4. The slide assembly of claim 1 in which said floating slide means includes a stop notch and in which said slide assembly includes an engagement member for engaging said notch to lock said floating slide in a predetermined position whereby the chassis is locked from translating with respect to the rack.

5. The slide assembly of claim 4 in which said engagement member is a spring-loaded arm rigidly attached to said bracket means and spring-loaded to move into a notch in said floating slide when the floating slide is translated with respect to said engagement member such that said stop notch becomes positioned in alignment with said engagement member.

6. A slide assembly for mounting a chassis relatively movable with respect to a rack comprising:
    slide guide means for rigid attachment to the chassis,
    floating slide means for slidably engaging said slide guide means and for supporting said chassis, said floating slide means including a first floating slide having a first channel for slidably engaging said slide guide means and having a second floating slide having a second channel where said second channel slidably engages said first floating slide,
    rack means for rigid attachment to said rack for slidably engaging said second floating slide whereby said chassis is relatively movable with respect to said rack by the translation of said floating slide means.

7. The slide assembly of claim 6 in which said rack means is a sheath with a channel for slidably engaging said second floating slide.

8. The slide assembly of claim 6 in which said rack means includes a slide guide for rigid attachment to said rack and in which said second floating slide includes a third channel for slidably engaging said second slide guide means.

9. The slide assembly of claim 8 in which said first and second channels have openings facing toward said chassis and in which said third channel has an opening facing toward said rack.

10. A slide assembly for mounting a chassis relatively movable with respect to a rack where first and second ones of said slide assembly are adapted to be located on first and second sides, respectively, of said chassis, each slide assembly comprising,
    slide guide means for rigid attachment to the chassis, said slide guide means including two or more studs having non-moving button-shaped ends,
    means having a channel for slidably engaging the button-shaped ends of said slide guide means and for supporting said chassis, whereby said chassis is relatively movable with respect to said rack.

11. A slide assembly for mounting a chassis relatively movable with respect to a rack where first and second ones of said slide assembly are adapted to be located on first and second sides, respectively, of said chassis, each slide assembly comprising, slide guide means for rigid attachment to the chassis, wherein said chassis includes two or more side mounting holes on each of said sides and wherein said slide guide means includes two or more metal studs of the same size adapted to be press fitted into said two or more mounting holes, respectively, and each having non-moving button-shaped ends for engaging said floating slide means, a metal floating slide means having a channel for slidably engaging said two or more studs for supporting said chassis, said floating slide means having face portions extending over the ends of said studs to prevent movement of the floating slide means except in the direction of the channel, sheath means having a channel for slidably engaging said floating slide, whereby said chassis is relatively movable with respect to said rack by the translation of said floating slide member with respect to said slide guide means and by the relative translation of said floating slide member with respect to said sheath means, said sheath means including bracket means for rigidly attaching a sheath to said rack, said bracket means having a recess whereby the outwardly facing side of said floating slide means is positioned within a clearance distance of the inwardly facing edge of the rack whereby the slide assembly requires a minimum amount of space so as to provide maximum space for said chassis in said rack.

* * * * *